(12) United States Patent
Kobinata

(10) Patent No.: US 6,492,070 B1
(45) Date of Patent: Dec. 10, 2002

(54) ELECTRON BEAM EXPOSURE MASK AND METHOD FOR MANUFACTURING ELECTRON BEAM EXPOSURE MASK

(75) Inventor: Hideo Kobinata, Tokyo (JP)

(73) Assignee: NEC Corporation, Tokyo (JP)

(*) Notice: Subject to any disclaimer, the term of this patent is extended or adjusted under 35 U.S.C. 154(b) by 68 days.

(21) Appl. No.: 09/626,117

(22) Filed: Jul. 26, 2000

(30) Foreign Application Priority Data

Jul. 28, 1999 (JP) .......................................... 11-213643

(51) Int. Cl.[7] .................................................. G03F 9/00
(52) U.S. Cl. ............................................................. 430/5
(58) Field of Search ........................ 430/5, 22; 378/34, 378/35; 716/19

(56) References Cited

U.S. PATENT DOCUMENTS 5,770,336 A * 6/1998 Choi .............................. 430/5
6,140,020 A * 10/2000 Cummings .................. 430/296
6,300,017 B1 * 10/2001 Rolfson et al. ................ 430/5

FOREIGN PATENT DOCUMENTS

| JP | A 7-78748 | 3/1995 |
| JP | A 9-293654 | 11/1997 |
| JP | A 1998-025503 | 7/1998 |

* cited by examiner

Primary Examiner—Mark F. Huff
Assistant Examiner—Saleha R. Mohamedulla
(74) Attorney, Agent, or Firm—Young & Thompson

(57) ABSTRACT

An electron beam exposure mask is provided with a substrate portion provided with an aperture and a thin film portion supported by the substrate portion. The thin film portion is provided with a thin semiconductor active film (the first semiconductor film) and a thick semiconductor active film (the second semiconductor film) thicker than the thin semiconductor active film. A fine pattern portion having small-gauge apertures is formed in the thin semiconductor active film and a coarse pattern portion having large-gauge apertures is formed in the thick semiconductor active film. As a result, a fine pattern portion can be formed partially.

16 Claims, 6 Drawing Sheets

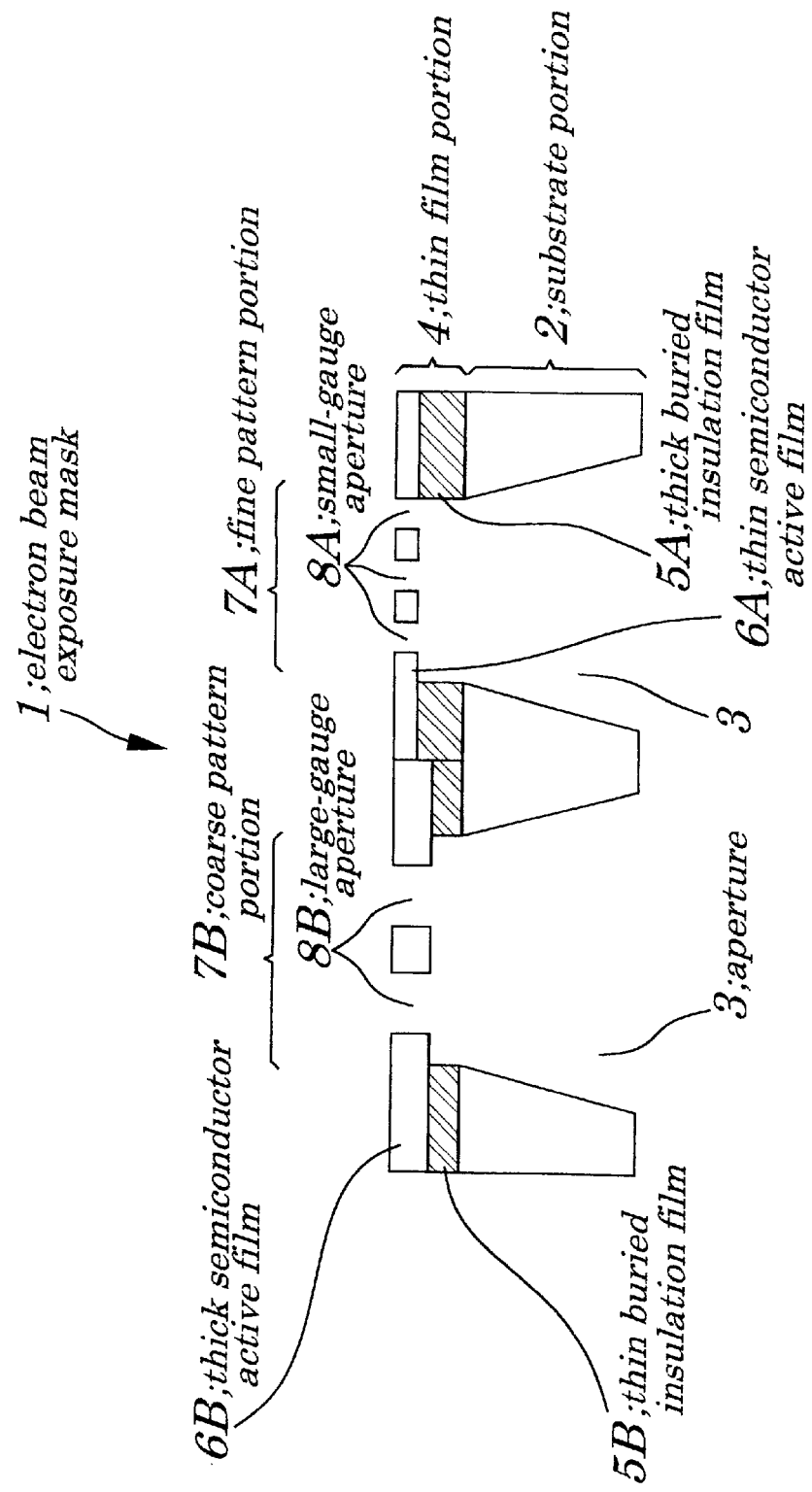

63; photoresist film

ELECTRON BEAM EXPOSURE MASK AND METHOD FOR MANUFACTURING ELECTRON BEAM EXPOSURE MASK

BACKGROUND OF THE INVENTION

1. Field of the Invention

The present invention relates to an electron beam exposure mask and a method for manufacturing the electron beam exposure mask and more particularly to the electron beam exposure mask and the method for manufacturing the electron beam exposure mask capable of forming fine patterns without losing mechanical strength.

2. Description of the Related Art

In manufacturing a semiconductor device represented by a LSI (Large-Scale Integrated)circuit, a lithography technology is essential in order to pattern various kinds of films, including insulation films such as a silicon oxidation film and a silicon nitride film formed on a semiconductor substrate and conductive films such as an aluminum alloy film and a copper alloy film, into desired shapes.

Conventionally, in this lithography technology, a photolithography technology is widely applied, in which a photoresist film is formed by coating photoresist having photosensitivity for ultraviolet rays, ultraviolet rays are irradiated (exposed) onto the photoresist film through a mask pattern, an ultraviolet ray irradiation area is made soluble (a positive type) or an ultraviolet ray non-irradiation area is made soluble (a negative type).

Now, as integration is improved with sophistication of the LSI, a lithography technology capable of further fine-processing is required. With this requirement, an electron beam lithography technology has been developed in which an electron beam of a wavelength shorter than that of the ultraviolet ray is used as an exposure medium.

In this electron beam lithography technology, an electron beam resist being photosensitive to an electron beam is used, and a desired pattern is represented by irradiating and exposing the electron beam to the electron beam resist. When the desired pattern is represented on the electron beam resist, a stencil mask, namely, an aperture mask (hereafter, called an electron beam exposure mask) is used. For the electron beam exposure mask, a material efficient in electron dispersion and in absorption and suitable for a fine process is used and generally a semiconductor film such as a silicon film is used.

FIG. 3 is a sectional view showing a conventional structure of an electron beam exposure mask.

An electron beam exposure mask 51, as shown in FIG. 3, is provided with a substrate portion 52 formed from a silicon single crystal or a like and provided with an aperture 53 and a thin film portion 54 supported by the substrate portion 52.

The thin film portion 54 is provided with a semiconductor active film 56 formed from a silicon single crystal through an buried insulation film 55 formed from a silicon oxide film or a like. The semiconductor active film 56 is provided with a pattern portion 57 provided with apertures 58 conducting to the semiconductor active film 56.

Here, the aperture 53 of the substrate portion 52 and the apertures 58 of the semiconductor active film 56 become electron beam passages during the electron beam exposure.

Explanations will be given of a method of manufacturing an electron beam exposure mask with reference to FIGS. 4A, 4B, 4C, 4D and 4E in accordance with a procedure.

First, as shown in FIG. 4A, a semiconductor substrate 60 formed from a silicon single crystal is used and an etching mask 61 formed from silicon oxide film, a silicon nitride film or a like is formed on a reverse of the semiconductor substrate 60 by a CVD (Chemical Vapor Deposition) process or a like.

Second, by applying a known SIMOX (Separation by IMplanted OXygen) technology to an obverse of the semiconductor substrate 60, oxygen ions are implanted to form the buried insulation film 55 of silicon oxide. The semiconductor active film 56 separated from the semiconductor substrate 60 by the buried insulation film 55 is formed.

Third, as shown in FIG. 4C, by applying a known photolithography process, necessary areas in the obverse of the semiconductor active film 56 are covered with photoresist film 62 and then dry etching is executed using the photoresist film 62 as a mask in order to form the semiconductor active film 56 in a desired shape, namely, in order to execute patterning. With this process, the pattern portion 57 of a desired shape having the apertures 58 is formed.

Fourth, after selectively etching the buried insulation film 55 exposed in the apertures 58, as shown in FIG. 4D, necessary areas in the etching mask are covered with photoresist film 63 and then dry etching is executed using the photoresist film 63 as a mask in order to form the etching mask 61 in a desired shape, namely, in order to execute patterning.

Fifth, after removing the photoresist film 63, wet etching is applied to the reverse of the semiconductor substrate 60 using the etching mask 61 as a mask and the semiconductor substrate 60 is selectively etched to form the apertures 53.

Finally, the etching mask 61 and the buried insulation film 55 exposed in the apertures 53 are removed by dry etching, and thereby the electron beam exposure mask 51 shown in FIG. 3 is completed.

Now, in a conventional electron beam exposure mask, there is a problem in that it is difficult to change a pattern accuracy partially since the semiconductor active film forming a pattern portion of a film portion supported by a substrate is formed wholly in a same film thickness.

In other words, concerning the electron beam exposure mask, though there is a case in that a pattern accuracy is changed partially on one mask and a fine pattern is formed on only a part of the mask according to a design rule, a film thickness of the above-mentioned semiconductor active film must be made thinner as to a processing precision to form such fine pattern.

However, when the film thickness of the semiconductor active film is made thin, mechanical strength of a mask deteriorates accordingly and a mask tolerance deteriorates. Therefore, the film thickness of the semiconductor active film must be thick to improve the mechanical strength of the mask.

For example, when the semiconductor active film is optimized to make a film thick in order to obtain mechanical strength, an aspect ratio becomes large in areas requiring a fine pattern. As a result, it is difficult to form fine apertures since a processing precision lacks. On the contrary, when the semiconductor active film is optimized to make a film thin, a fine pattern can be formed easily. However, the mechanical strength deteriorates since the whole mask becomes thin.

As above described, in manufacturing the electron beam exposure mask, forming the fine pattern is contrary to improving mechanical strength. Conventionally, since a film thickness of a semiconductor active film in which a pattern is formed is set to an identical thickness, there is a limitation in that a mask can be manufactured only from the viewpoint of forming the fine pattern or improving the mechanical strength.

Further, conventionally, instead of the semiconductor substrate, an SOI (Silicon On Insulator) substrate being two laminated substrates is manufactured. However, these two substrates are laminated under high tension, therefore, a mask is flexible under tension when the mask is made thinner. In addition, there are cases in that evenness during laminating deteriorates and in that since voids are apt to occur, etching liquid seeps in the voids in the manufacturing process and thereby the pattern is broken.

SUMMARY OF THE INVENTION

In view of the above, it is an object of the present invention to provide an electron beam exposure mask and a method of manufacturing the electron beam exposure mask, in which forming a fine pattern is compatible with improving mechanical strength.

According to a first aspect of the present invention, there is provided an electron beam exposure mask provided with a substrate portion, a thin film portion supported by the substrate portion, and a pattern portion formed into a desired shape in a semiconductor film formed through a buried insulation film in the thin film portion: wherein a first semiconductor film and a second semiconductor film thicker than the first semiconductor film are formed in the thin film portion; a fine pattern portion having small-gauge apertures is formed in the first semiconductor film; and a coarse pattern portion having large-gauge apertures is formed in the second semiconductor film.

In the foregoing first aspect, a preferable mode is one wherein the first semiconductor film is formed through a first buried insulation film and the second semiconductor film is formed through a second buried insulation film thinner than the first buried insulation film in the substrate portion.

In the foregoing, a preferable mode is one wherein an aperture conductive to the small-gauge apertures and conductive to the large-gauge apertures is formed in the substrate portion.

According to a second aspect of the present invention, there is provided a method of manufacturing an electron beam exposure mask including: a first semiconductor film forming step of forming an etching mask on:an obverse of a semiconductor substrate and forming an insulation film on a reverse of the semiconductor substrate and of forming a semiconductor film separated from the semiconductor substrate through a buried insulation film; a second semiconductor film forming step of increasing a thickness of the buried insulation film partially to divide the buried insulation film into a first buried insulation film and a second buried insulation film thinner than the first buried insulation film and of forming a first semiconductor film on the first buried insulation film and forming a second semiconductor film thicker than the first semiconductor film on the second buried insulation film; a pattern forming step of forming a fine pattern portion having small-gauge apertures in the first semiconductor film and forming a coarse pattern portion having large-gauge apertures in second semiconductor film; an etching mask patterning step of patterning the etching mask in a desired shape; and a semiconductor substrate etching step of selectively etching the reverse of the semiconductor substrate using the etching mask as a mask to form an aperture conductive to the small-gauge apertures and the large-gauge apertures.

In the foregoing, a preferable mode is one further including an etching step of etching the first buried insulation film and the second buried insulation film exposed to the etching mask and exposed in the aperture.

In the foregoing, a preferable mode is one wherein oxygen ions are implanted to form the buried insulation film in the first semiconductor forming step and to form the first buried insulation film and second buried insulation film in the second semiconductor forming step.

In the foregoing, a preferable mode is one wherein a SIMOX (Separation by IMplanted OXygen) technology is applied to the first semiconductor film forming step and to the second semiconductor film forming step.

In the foregoing, a preferable mode is one wherein a silicon nitride film or a silicon oxide film is used as the etching mask.

According to a third aspect of the present invention, there is provided an electron beam exposure mask including a substrate portion, a thin film portion supported by the substrate portion and a pattern portion formed into a desired shape in a semiconductor film formed through a buried insulation film in the thin film portion, the electron beam exposure mask including: a first semiconductor film formed in the thin film portion; a second semiconductor film thicker than the first semiconductor film in the thin film portion; a fine pattern portion having small-gauge apertures in the first semiconductor film; and a coarse pattern portion having large-gauge apertures in the second semiconductor film.

According to a fourth aspect of the present invention, there is provided a media for storing a program for manufacturing an electron beam exposure mask, the program including: a first semiconductor film forming step of forming an etching mask on an obverse of a semiconductor substrate and forming an insulation film on a reverse of the semiconductor substrate and of forming a semiconductor film separated from the semiconductor substrate through the buried insulation film; a second semiconductor film forming step of increasing a thickness of the buried insulation film partially to divide the buried insulation film into a first buried insulation film and a second buried insulation film thinner than the first buried insulation film and of forming a first semiconductor film on the first buried insulation film and forming a second semiconductor film thicker than the first semiconductor film on the second buried insulation film; a pattern forming step of forming a fine pattern portion having small-gauge apertures in the first semiconductor film and forming a coarse pattern portion having large-gauge apertures in the second semiconductor film; an etching mask patterning step of patterning the etching mask in a desired shape; and a semiconductor substrate etching step of selectively etching the reverse of the semiconductor substrate using the etching mask as a mask to form an aperture conductive to the small-gauge apertures and the large-gauge apertures.

BRIEF DESCRIPTION OF THE DRAWINGS

The above and other objects, advantages, and features of the present invention will be more apparent from the following description taken in conjunction with the accompanying drawings in which:

FIG. 1 is a sectional view showing a structure of an electron beam exposure mask according to an embodiment of the present invention;

DETAILED DESCRIPTION OF THE PREFERRED EMBODIMENTS

Best modes for carrying out the present invention will be described in further detail using a embodiment with reference to the accompanying drawings.

FIG. 1 is a sectional view showing a structure of an electron beam exposure mask according to an embodiment of the present invention. FIGS. 2A, 2B, 2C, 2D, 2E and 2F are views showing a procedure of manufacturing the electron beam exposure mask in order of process according to the embodiment.

An electron beam exposure mask of the embodiment, as shown in FIG. 1, is provided with a substrate portion 2 formed from a silicon single crystal or a like and provided with apertures 3 and a thin film portion 4 supported by the substrate portion 2. In the thin film portion 4, a thin semiconductor active film (a first semiconductor film) 6A and a thick semiconductor active film (a second semiconductor film) 6B thicker than the thin semiconductor active film (a first semiconductor film) 6A are formed. The thin semiconductor active film 6A is provided with a fine pattern portion 7A having small-gauge apertures 8A. The thick semiconductor active film 6B is provided with a coarse pattern portion 7B having large-gauge apertures 8B.

The thin semiconductor active film 6A is formed on the substrate portion 2 through a thick buried insulation film 5A. The thick semiconductor active film 7B is formed on the substrate portion 2 through a thin buried insulation film 5B thinner than the thick buried insulation film 5A.

The aperture 3 of the substrate portion 2 is introduced to the small-gauge apertures 8A in the thin semiconductor active film 6A and is introduced to the large-gauge apertures 8B in the thick semiconductor active film 6B. Each aperture 3, the small-gauge apertures 8A and the large-gauge apertures 8B is an electron beam passage hole during electron beam exposure.

Here, a thickness of the substrate portion 2 is set to 400 $\mu$m to 700 $\mu$m. In addition, a thickness of the thick buried insulation film 5A being the fine pattern portion 7A is 5 $\mu$m to 20 $\mu$m and a thickness of the thin semiconductor active film 6A is 1 $\mu$m to 8 $\mu$m. A thickness of the thin buried insulation film 5B being the coarse pattern portion 7B is 1 $\mu$m to 8 $\mu$m and a thickness of the thick semiconductor active film 6B is 5 $\mu$m to 20 $\mu$m.

Next, explanations will be given of a procedure of manufacturing the electron beam exposure mask in order of process with reference to FIG. 2A through FIG. 2F.

Figure 2A:
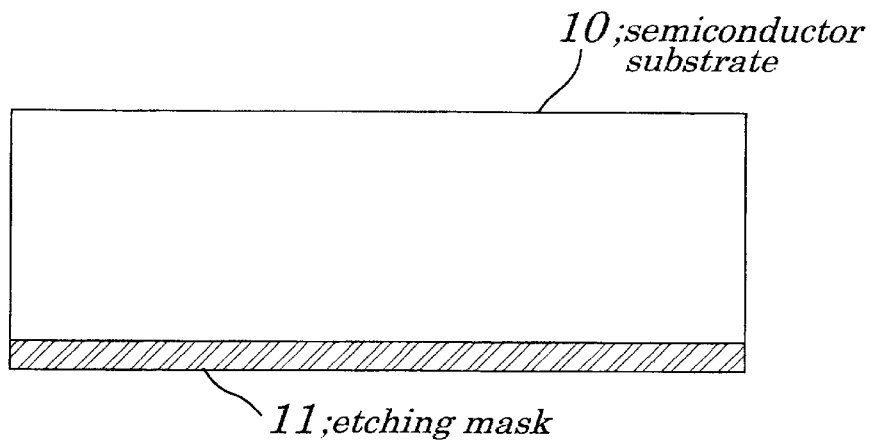
FIGS. 2A, 2B, 2C, 2D, 2E and 2F are views showing a procedure of manufacturing the electron beam exposure mask in order of process according to the embodiment of the present invention.

First, as shown in FIG. 2A, using a semiconductor substrate 10 formed from a silicon single crystal of a thickness from 400 $\mu$m to 700 $\mu$m, an etching mask 11 formed from a silicon nitride film, a silicon oxide film or a like of a thickness from 0.1 $\mu$m to 0.3 $\mu$m is formed on the reverse of the semiconductor substrate 10 by a CVD process or a like.

The silicon nitride film and the silicon oxide film are easy to be formed in a film and have a good selective ratio with the semiconductor substrate 10, therefore, these are superior as an etching mask.

Figure 2B:
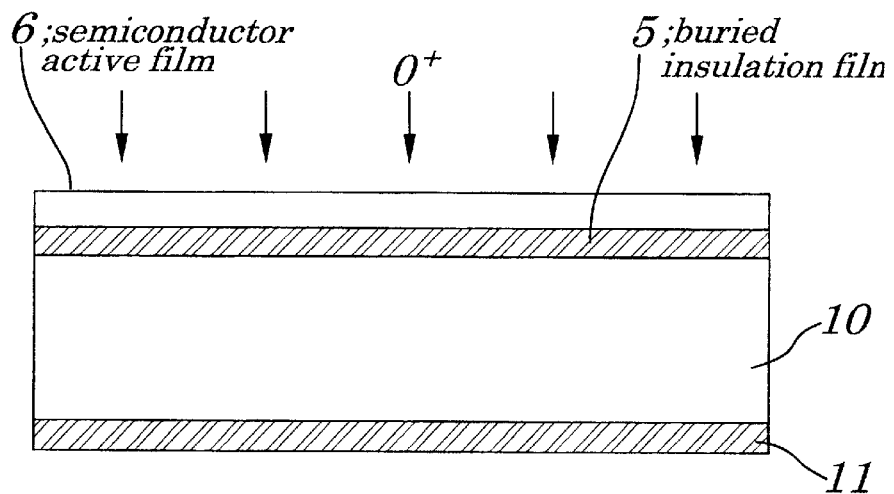

Second, as shown in FIG. 2B, by applying a known SIMOX (Separation by IMplanted OXygen) technology to an obverse of the semiconductor substrate 10, oxygen ions are implanted to form buried insulation film 5 being a silicon oxide film of 1 $\mu$m to 8 $\mu$m. The semiconductor active film 6 of 1 $\mu$m to 8 $\mu$m separated from the semiconductor substrate 10 is formed through the buried film 5.

Figure 2C:
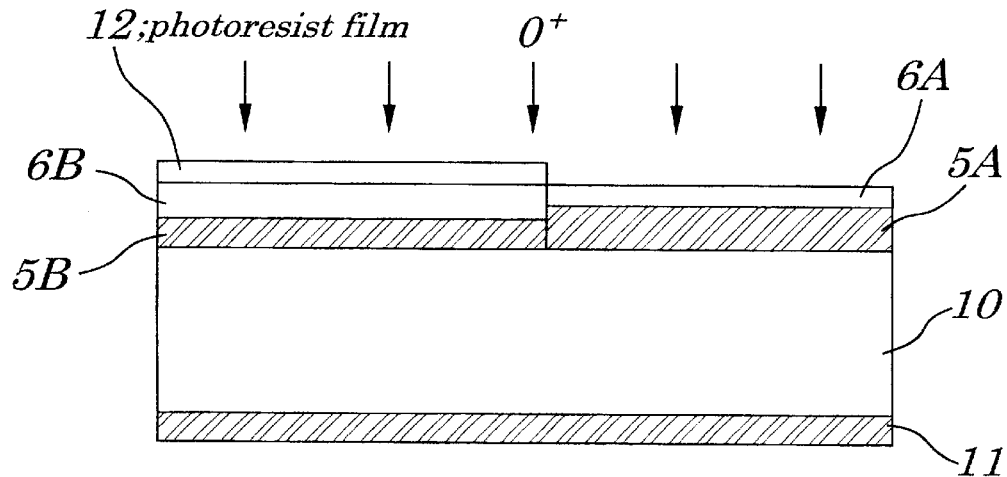

Third, as shown in FIG. 2C, by applying a known photolithography process, an area in which the coarse pattern portion is formed in the obverse of the semiconductor substrate 10 is covered with the photoresist film 13 and then oxygen ions are implanted similarly to that shown in FIG. 2B.

As a result, oxygen ions are selectively implanted in an area in which the fine pattern portion is formed. A thickness of an buried insulation film in this area increases from 5 $\mu$m to 20 $\mu$m and this buried insulation film becomes the thick buried insulation film 5A.

On the other hand, no oxygen ion is implanted in another area of the buried insulation film 5 masked by the photoresist film 12, a thickness of the area maintains at 1 $\mu$m to 8 $\mu$m and then this buried insulation film becomes the thin buried insulation film 5B thinner than the thick buried insulation film 5A.

Therefore, with the process shown in FIG. 2C, the buried insulation film 5 is divided into thick buried insulation film 5A and thin buried insulation film 5B. On the thick buried insulation film 5A, the thin semiconductor active film 6A of which the thickness is 1 $\mu$m to 8 $\mu$m is formed, and on the thin buried insulation film 5B, the thick semiconductor active film 6B of which the thickness is 5 $\mu$m to 20 $\mu$m is formed.

Figure 2D:
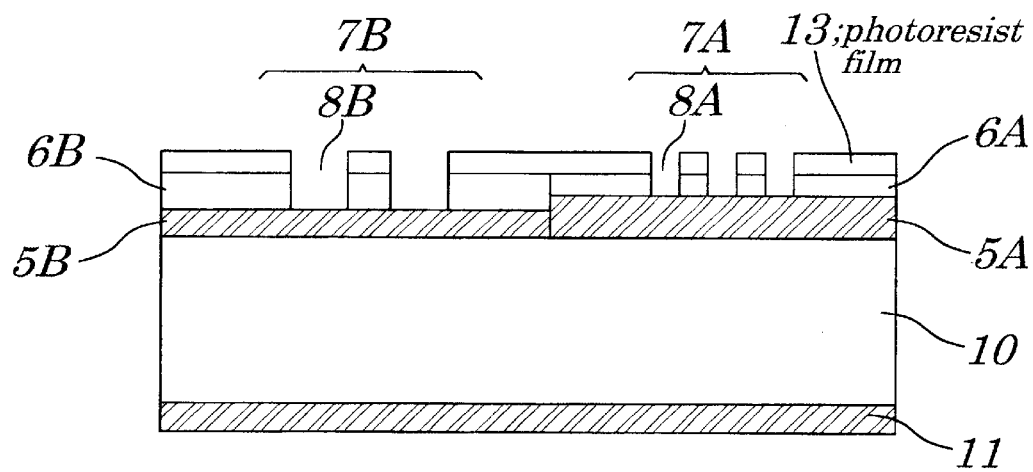

Fourth, as shown in FIG. 2D, by applying a known photolithography process, necessary areas in the obverse of the thin semiconductor active film 6A and the thick semiconductor active film 6B are covered with the photoresist film 13 and then dry etching is executed using the photoresist film 13 as a mask in order to form the thin semiconductor active film 6A and the thick semiconductor active film 6B in respective desired shapes, namely, in order to execute patterning. With this process, in the thin semiconductor active film 6A, the fine pattern portion 7A having the small-gauge apertures 8A is formed and in the thick semiconductor active film 6B, the coarse pattern portion 7B having the large-gauge apertures 8B is formed.

Figure 2E:
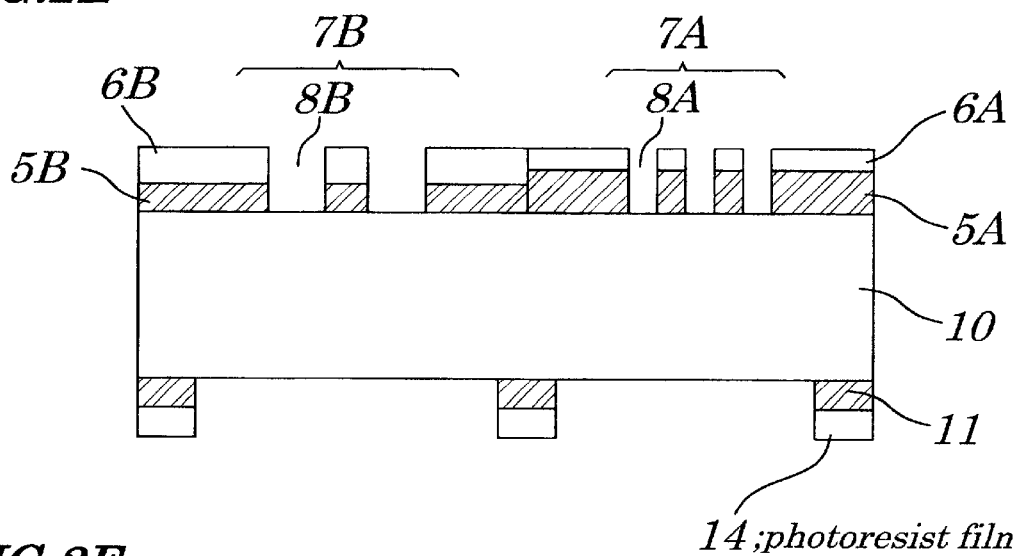

Fifth, after selectively etching the thick buried insulation film 5A exposed in the small-gauge apertures 8A and the thin buried insulation film 5B exposed in the large-gauge apertures 8B, as shown in FIG. 2E, necessary areas in the etching mask 11 are covered with the photoresist film 14 and then dry etching is executed using the photoresist film 14 as a mask in order to form the etching mask 11 in a desired shape, namely, in order to execute patterning.

Figure 2F:
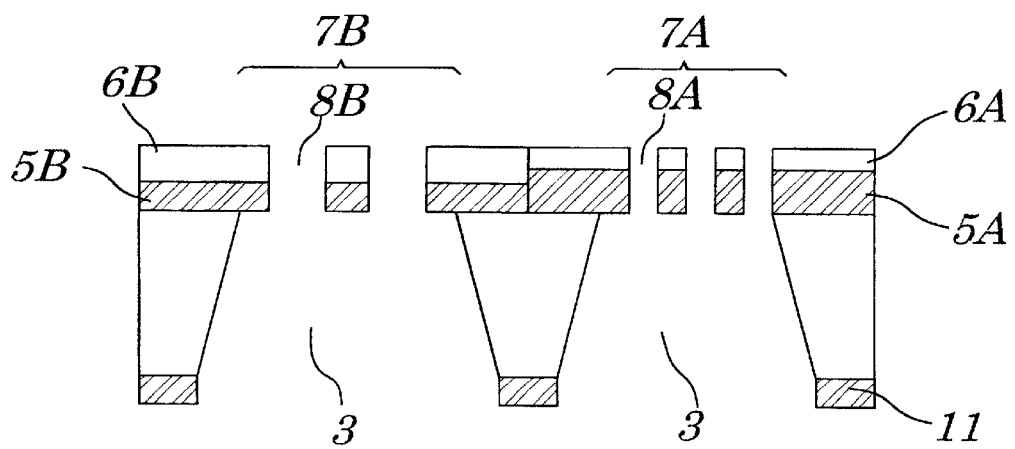
Figure 3:
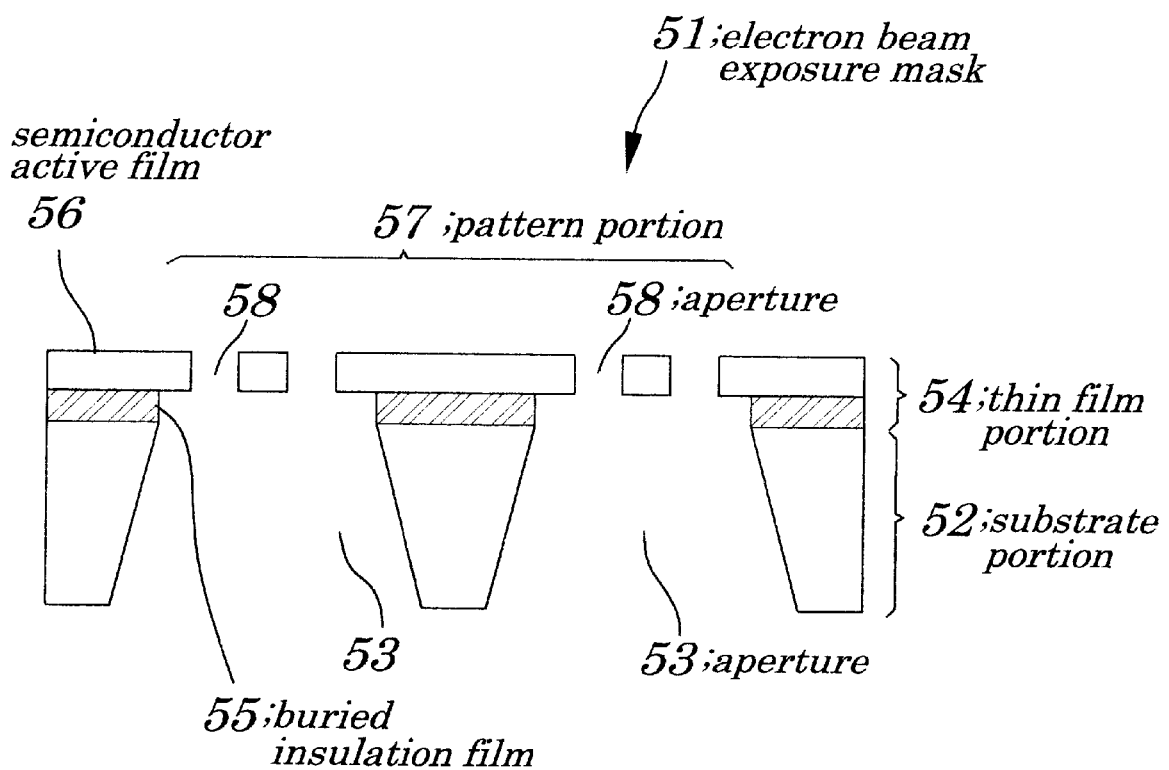
FIG. 3 is a sectional view showing a structure of a conventional electron beam exposure mask.
Figure 4A:
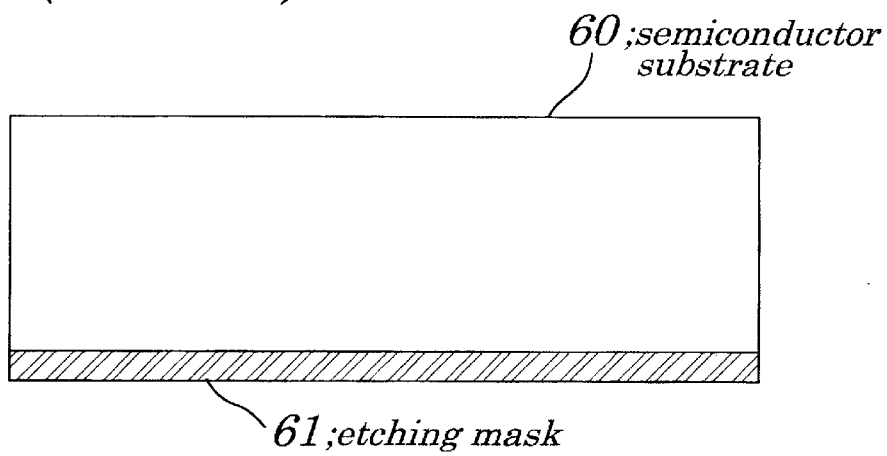
FIGS. 4A, 4B, 4C, 4D and 4E are views showing a procedure of manufacturing a conventional electron beam exposure mask in order of process.
Figure 4B:
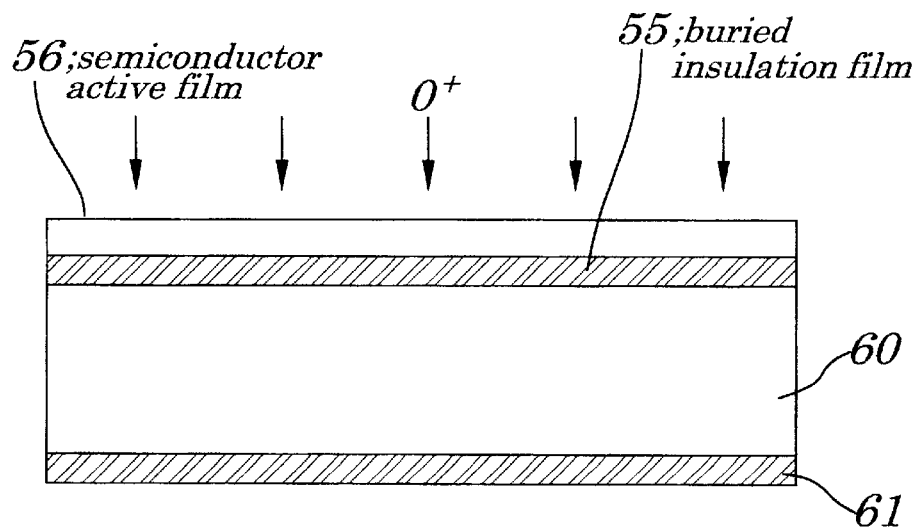
Figure 4C:
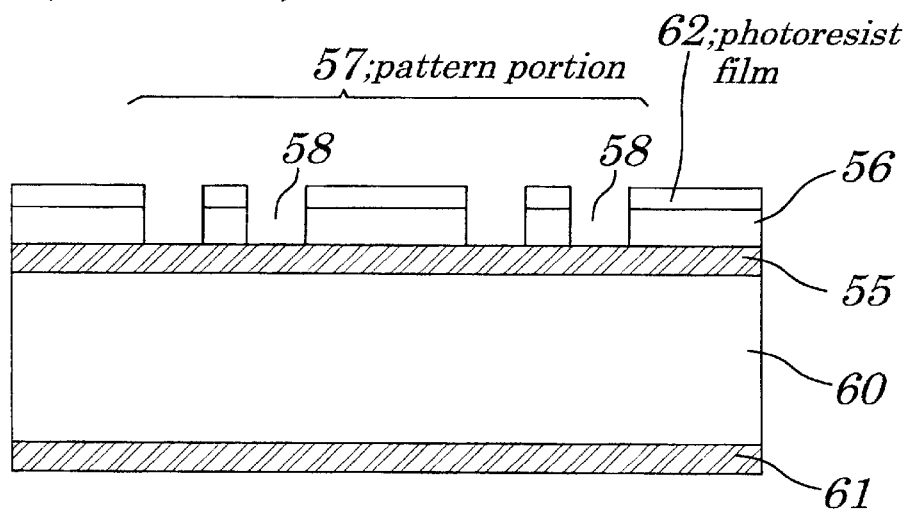
Figure 4D:
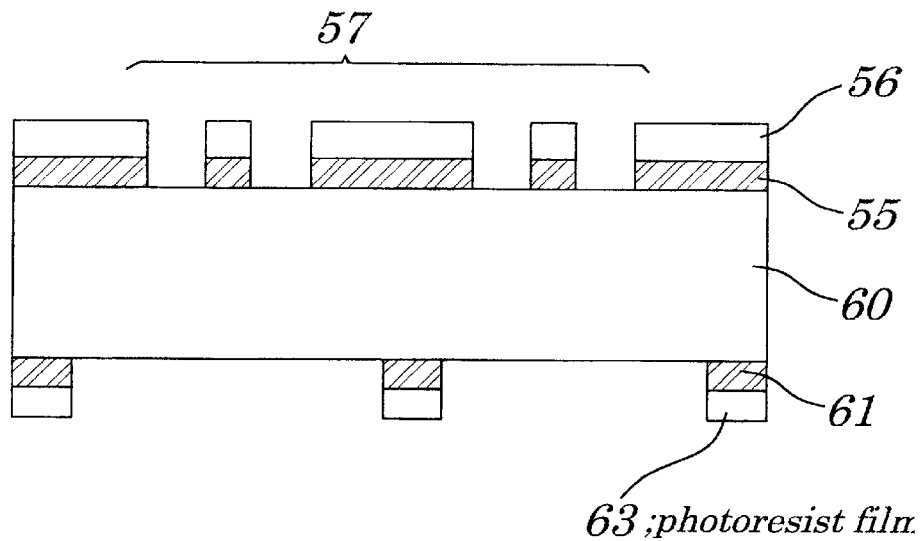
Figure 4E:
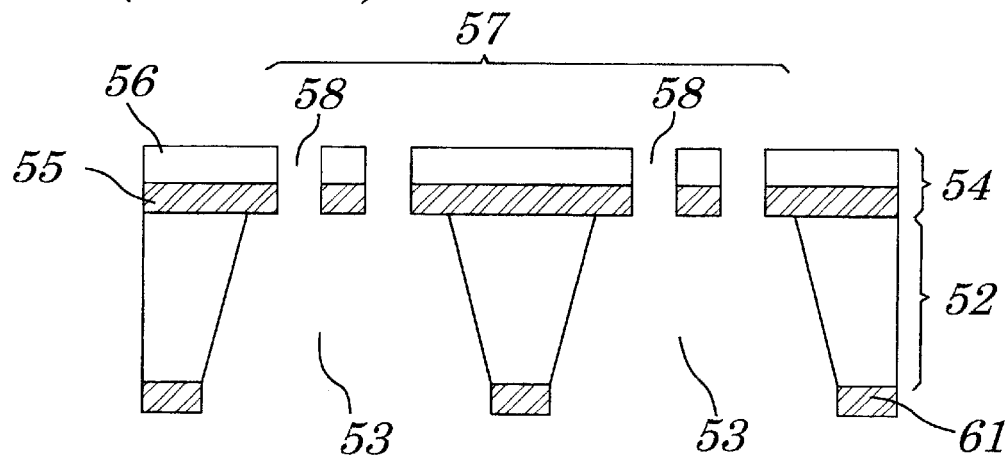

Sixth, as shown in FIG. 2F, after removing the photoresist film 14, wet etching is applied to the reverse of the semiconductor substrate 10 using the etching mask 11 as a mask and the semiconductor substrate 10 is selectively etched to form the apertures 3.

Finally, the etching mask 11, the thick buried insulation film 5A exposed in the small-gauge apertures 8A and the thin buried insulation film 5B exposed in the large-gauge apertures 8B are removed by the dry etching, and thereby the electron beam exposure mask 1 shown in FIG. 1 is completed.

According to the above-mentioned manufacturing procedure for the electron beam exposure mask, since the fine pattern portion 7A is formed in the thin semiconductor active film 6A previously formed on the obverse of the semiconductor substrate 10 through thick buried insulation film 5A, the pattern can be processed with high accuracy. As a result, it is possible to optimize a semiconductor active film into a thin film and to form a desired fine pattern easily.

Further, since the coarse pattern portion 7B is formed in the thick semiconductor active film 6B previously formed on the obverse of the semiconductor substrate 10 through thin buried insulation film 5B, the pattern can be processed with high accuracy. As a result, since it is possible to keep a thick film, it is possible to optimize a semiconductor active film into a thick film so that mechanical strength can be improved.

With these processes, an aspect ratio is optimized in accordance with a pattern processing precision, and a pattern etching agreeable to a design measurement becomes possible without influences of measurement changes by a loading effect during dry etching of a semiconductor active film.

Accordingly, though -there is a requirement in that the pattern precision is partially changed on a mask according to a design rule and a fine pattern is formed only in one part, the requirement is satisfied without losing mechanical strength.

As above described, since the mechanical strength in a coarse area according to the design rule of thickening the semiconductor active film, a mask tolerance can be improved when a semiconductor device is mounted on an inspection unit or a like. In addition, in an area requiring a fine pattern, a semiconductor active film is thinned, therefore, influences are minimized and thereby a limit-process-dimension can be cut down.

According to this embodiment, the electron beam exposure mask is provided with the substrate portion 2 provided with an aperture 3 and the thin film portion 4 supported by the substrate portion 2. The thin film portion 4 is provided with the thin semiconductor active film (the first semiconductor film) 6A and the thick semiconductor active film (the second semiconductor film) 6B thicker than the thin semiconductor active film 6A. The fine pattern portion 7A having small-gauge apertures 8A is formed in the thin semiconductor active film 6A and the coarse pattern portion 7B having large-gauge apertures 8B is formed in the thick semiconductor active film 6B. As a result, a fine pattern portion can be formed partially.

Accordingly, it is possible to be compatible in improving mechanical strength with forming a fine pattern.

The embodiment of the present invention is explained in detail with reference to drawings, however, a concrete structure is not limited to this embodiment and the present invention includes changes and modifications of design without departing from the scope and spirit of the invention.

For example, a material to be a substrate portion is not limited to a silicon single crystal other semiconductor films can be used. A SOI substrate also can be used.

In addition, the present invention is explained with reference to an electron beam exposure mask for manufacturing a semiconductor device as a example; however, the present invention is not limited to this and can be applied to any use requiring a fine pattern process.

In addition, this embodiment shows examples of each thickness of semiconductor films and insulation films, a film forming process and a like; but, it is possible to modify these in accordance with an use, a purpose or a like.

As described above, according to the present invention, the electron beam exposure mask is provided with the substrate portion provided with an aperture and the thin film portion supported by the substrate portion. The thin film portion is provided with the thin semiconductor active film and the thick semiconductor active film thicker than the thin semiconductor active film. The fine pattern portion having small-gauge apertures is formed in the thin semiconductor active film and the coarse pattern portion having large-gauge apertures is formed in the thick semiconductor active film. As a result, a fine pattern portion can be formed partially.

According to the manufacturing process of the electron beam exposure mask, the fine pattern portion is formed in the thin semiconductor active film previously formed through the thick buried insulation film on the semiconductor substrate and the coarse pattern portion is formed in the thick semiconductor active film previously formed through the thin buried insulation film on the semiconductor substrate. As a result, it is possible to manufacture easily a mask in which a pattern accuracy is changed partially without losing mechanical strength.

Accordingly, it is also possible to improve mechanical strength while forming a fine pattern.

Finally, the present application claims the priority based on Japanese Patent Application No. Heill-213643 filed on Jul. 28, 1999, which is herein incorporated by reference.

What is claimed is:

1. An electron beam exposure mask comprising:

a substrate portion;

a thin film portion supported by said substrate portion, said thin film portion comprising a semiconductor film on a buried insulation film, wherein said semiconductor film has a first semiconductor film portion and a second semiconductor film portion that is coplanar with and thicker than said first semiconductor film portion, and wherein a fine pattern portion having small-gauge apertures is formed in said first semiconductor film portion and a coarse pattern portion having large-gauge apertures is formed in said second semiconductor film portion.

2. The electron beam exposure mask according to claim 1, wherein said first semiconductor film portion is on a first portion of said buried insulation film and said second semiconductor film portion is on a second portion of said buried insulation film that is thinner than said first portion of said buried insulation film.

3. The electron beam exposure mask according to claim 1, wherein an aperture conductive to said small-gauge apertures and conductive to said large-gauge apertures is formed in said substrate portion.

4. The electron beam exposure mask according to claim 2, wherein an aperture conductive to said small-gauge apertures and conductive to said large-gauge apertures is formed in said substrate portion.

5. A method of manufacturing an electron beam exposure mask comprising:

a first semiconductor film forming step of forming an etching mask on an obverse of a semiconductor substrate and forming an insulation film on a reverse of said semiconductor substrate and of forming a semiconductor film on the insulation film;

a second semiconductor film forming step of increasing a thickness of the insulation film partially to divide the insulation film into a first buried insulation film and a second buried insulation film that is coplanar with and thinner than said first buried insulation film and of forming a first portion of the semiconductor film on said first buried insulation film and forming a second portion of the semiconductor film that is coplanar with and thicker than said first portion of the semiconductor film on said second buried insulation film;

a pattern forming step of forming a fine pattern portion having small-gauge apertures in said first portion of the semiconductor film and forming a coarse pattern portion having large-gauge apertures in said second portion of the semiconductor film;

an etching mask patterning step of patterning said etching mask in a desired shape; and a semiconductor substrate etching step of selectively etching a reverse of said semiconductor substrate using said etching mask as a mask to form an aperture conductive to said small-gauge apertures and said large-gauge apertures.

6. The method of manufacturing an electron beam exposure mask according to claim 5, further comprising:

an etching step of etching said first buried insulation film and said second buried insulation film exposed to said etching mask and exposed in said aperture.

7. The method of manufacturing an electron beam exposure mask according to claim 5, wherein oxygen ions are implanted to form said insulation film in said first semiconductor forming step and to form said first buried insulation film and second buried insulation film in said second semiconductor forming step.

8. The method of manufacturing an electron beam exposure mask according to claim 5, wherein a SIMOX (Separation by IMplanted OXygen) technology is applied to said first semiconductor film forming step and to said second semiconductor film forming step.

9. The method of manufacturing an electron beam exposure mask according to claim 5, wherein a silicon nitride film or a silicon oxide film is used as said etching mask.

10. The method of manufacturing an electron beam exposure mask according to claim 6, wherein a silicon nitride film or a silicon oxide film is used as said etching mask.

11. The method of manufacturing an electron beam exposure mask according to claim 7, wherein a silicon nitride film or a silicon oxide film is used as said etching mask.

12. The method of manufacturing an electron beam exposure mask according to claim 8, wherein a silicon nitride film or a silicon oxide film is used as said etching mask.

13. An electron beam exposure mask comprising:

a substrate having first openings therethrough; and a thin film laminate that includes an insulation film on said substrate and a semiconductor film on said insulation film, said thin film laminate having two coplanar portions that are adjacent to each other, wherein a first of said two portions includes said insulation film having a first thickness and said semiconductor film having a second thickness, and a second of said two portions includes said insulation film having a third thickness and said semiconductor film having a fourth thickness less than said second thickness, and wherein said first portion has first holes therethrough and said second portion has second holes therethrough, said first and second holes being in registration with and opening into respective ones of said first openings and having smaller diameters than respective ones of said first openings, said first holes having larger diameters than said second holes.

14. The mask of claim 13, wherein a sum of said first and second thicknesses is substantially the same as a sum of said third and fourth thicknesses.

15. The mask of claim 13, wherein said third thickness is greater than said first thickness.

16. The mask of claim 13, wherein said insulation film is directly on said substrate and said semiconductor film is directly on said insulation film.

* * * * *